(12) United States Patent
Sasaki et al.

(10) Patent No.: US 11,254,844 B2
(45) Date of Patent: Feb. 22, 2022

(54) PRESSURE-SENSITIVE ADHESIVE TAPE FOR PROTECTING SEMICONDUCTOR

(71) Applicant: NITTO DENKO CORPORATION, Ibaraki (JP)

(72) Inventors: Takatoshi Sasaki, Ibaraki (JP); Kouji Mizuno, Ibaraki (JP); Takayuki Toda, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 1 day.

(21) Appl. No.: 16/579,656

(22) Filed: Sep. 23, 2019

(65) Prior Publication Data
US 2020/0095475 A1    Mar. 26, 2020

(30) Foreign Application Priority Data

Sep. 25, 2018  (JP) .............................. JP2018-179023

(51) Int. Cl.
*C09J 7/38*    (2018.01)
*C09J 201/02*    (2006.01)

(52) U.S. Cl.
CPC .............. *C09J 7/385* (2018.01); *C09J 201/02* (2013.01); *C09J 2203/326* (2013.01); *C09J 2301/122* (2020.08); *C09J 2301/302* (2020.08); *Y10T 428/28* (2015.01); *Y10T 428/2809* (2015.01); *Y10T 428/2848* (2015.01); *Y10T 428/2891* (2015.01)

(58) Field of Classification Search
None
See application file for complete search history.

(56) References Cited

U.S. PATENT DOCUMENTS

| 2003/0064579 A1* | 4/2003 | Miyakawa | ................. | C09J 7/29 |
| | | | | 438/628 |
| 2007/0054469 A1* | 3/2007 | Yano | ......................... | C09J 7/29 |
| | | | | 438/459 |

FOREIGN PATENT DOCUMENTS

JP    2011151163 A    8/2011

* cited by examiner

*Primary Examiner* — Anish P Desai
(74) *Attorney, Agent, or Firm* — Alleman Hall Creasman & Tuttle LLP

(57) ABSTRACT

Provided is a pressure-sensitive adhesive tape for protecting a semiconductor that can satisfactorily fill an uneven surface and is prevented from an adhesive residue. The pressure-sensitive adhesive tape for protecting a semiconductor includes: a base material; a pressure-sensitive adhesive layer arranged on at least one side of the base material; and an intermediate layer arranged between the base material and the pressure-sensitive adhesive layer, wherein a storage modulus of elasticity A (MPa) of the pressure-sensitive adhesive layer, a thickness B (μm) of the intermediate layer, a thickness C (μm) of the pressure-sensitive adhesive layer, and a tack value D (N) of the pressure-sensitive adhesive layer satisfy the formula A×(B/C)×D≥20 (MPa·N).

4 Claims, 1 Drawing Sheet

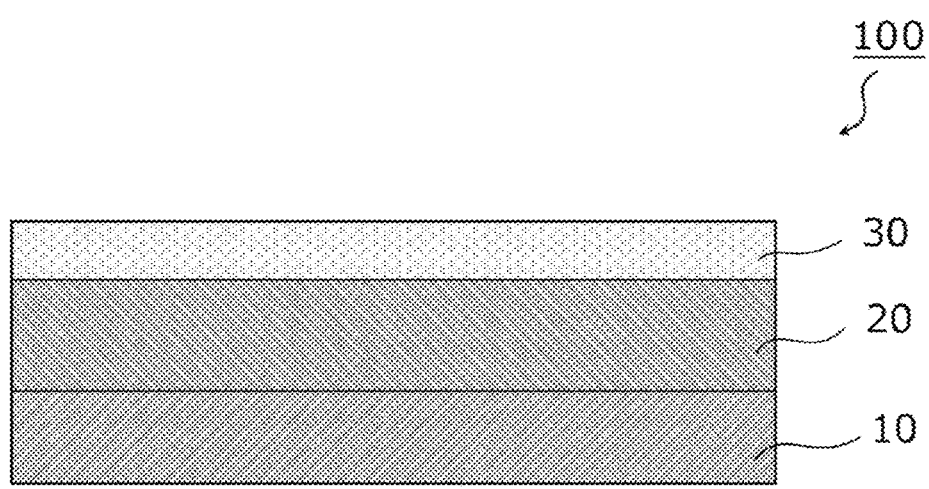

PRESSURE-SENSITIVE ADHESIVE TAPE FOR PROTECTING SEMICONDUCTOR

BACKGROUND OF THE INVENTION

Field of the Invention

The present invention relates to a pressure-sensitive adhesive tape for protecting a semiconductor.

Description of the Related Art

At the time of the production of a semiconductor chip, a backgrinding step of grinding the back surface of a semiconductor wafer to a desired thickness has heretofore been performed. In the backgrinding step, a pressure-sensitive adhesive tape for protection (backgrinding tape) has been used for fixing the semiconductor wafer or protecting a surface opposite to its surface to be ground (e.g., Japanese Patent Application Laid-open No. 2011-151163). The backgrinding tape typically includes a base material and a pressure-sensitive adhesive layer. Such backgrinding tape is used by bonding its pressure-sensitive adhesive layer side to the front surface of the semiconductor wafer (surface opposite to the surface to be ground of the wafer), and is peeled after the back surface of the semiconductor wafer has been ground.

Meanwhile, a semiconductor chip including a bump serving as an electrode on its surface, such as a flip-chip-type semiconductor chip to be used in a fingerprint authentication sensor, has been known as a semiconductor chip. In the production of such semiconductor chip, the following is performed. While the bump surface of a semiconductor wafer including a bump is covered with the backgrinding tape, the back surface of the wafer is ground. The backgrinding tape using a thermoplastic pressure-sensitive adhesive has been frequently used as the backgrinding tape to be used as described above because its followability to a bump may be improved by heating. In recent years, however, along with the thinning of the semiconductor wafer, melting of the thermoplastic pressure-sensitive adhesive due to grinding heat may be a problem.

A backgrinding tape using an acrylic pressure-sensitive adhesive as a pressure-sensitive adhesive excellent in heat resistance has heretofore been known, but an acrylic pressure-sensitive adhesive adjusted to be so soft as to fill the unevenness of a bump has a problem in that adhesive residue occurs after its peeling.

SUMMARY OF THE INVENTION

It is an object of the present invention to provide a pressure-sensitive adhesive tape for protecting a semiconductor that can satisfactorily fill an uneven surface and is prevented from having adhesive residue.

According to at least one embodiment of the present invention, there is provided a pressure-sensitive adhesive tape for protecting a semiconductor, including: a base material; a pressure-sensitive adhesive layer arranged on at least one side of the base material; and an intermediate layer arranged between the base material and the pressure-sensitive adhesive layer, wherein a storage modulus of elasticity A (MPa) of the pressure-sensitive adhesive layer, a thickness B (μm) of the intermediate layer, a thickness C (μm) of the pressure-sensitive adhesive layer, and a tack value D (N) of the pressure-sensitive adhesive layer satisfy the following formula:

$$A \times (B/C) \times D \geq 20 (\text{MPa} \cdot \text{N}).$$

In at least one embodiment of the present invention, when a load value is measured by thermomechanical analysis (TMA) through indentation of a probe having a diameter of 1.0 mm into the pressure-sensitive adhesive layer to an indentation depth corresponding to 80% of a total thickness of the pressure-sensitive adhesive layer and the intermediate layer, a load change amount (μN/(mm²·sec)) from 1 second to 300 seconds after a start of the measurement is 1,600 (μN/(mm²·sec)) or less.

In at least one embodiment of the present invention, the pressure-sensitive adhesive layer has a thickness of 2 μm to 50 μm.

In at least one embodiment of the present invention, the intermediate layer has a thickness of 50 μm to 500 μm.

In at least one embodiment of the present invention, the pressure-sensitive adhesive layer has a tack value of 0.05 N to 0.5 N.

According to at least one embodiment of the present invention, the pressure-sensitive adhesive tape for protecting a semiconductor that can satisfactorily fill an uneven surface and is prevented from having the adhesive residue can be provided.

BRIEF DESCRIPTION OF THE DRAWINGS

FIG. 1 is a schematic sectional view of a pressure-sensitive adhesive tape for protecting a semiconductor according to at least one embodiment of the present invention.

DESCRIPTION OF THE EMBODIMENTS

A. Summary of Pressure-Sensitive Adhesive Tape for Protecting Semiconductor

FIG. 1 is a schematic sectional view of a pressure-sensitive adhesive tape for protecting a semiconductor according to at least one embodiment of the present invention. A pressure-sensitive adhesive tape 100 for protecting a semiconductor according to at least one embodiment of the present invention includes: a base material 10; a pressure-sensitive adhesive layer 30 arranged on at least one side of the base material 10; and an intermediate layer 20 arranged between the base material 10 and the pressure-sensitive adhesive layer 30. In the pressure-sensitive adhesive tape 100 for protecting a semiconductor according to at least one embodiment of the present invention, a release liner may be arranged outside the pressure-sensitive adhesive layer 30 for the purpose of protecting a pressure-sensitive adhesive surface until the tape is used, though the liner is not shown. The pressure-sensitive adhesive tape 100 for protecting a semiconductor according to at least one embodiment of the present invention may be suitably used as, for example, a backgrinding tape.

In the pressure-sensitive adhesive tape 100 for protecting a semiconductor according to at least one embodiment of the present invention, a storage modulus of elasticity A (MPa) of the pressure-sensitive adhesive layer 30, a thickness B (μm) of the intermediate layer 20, a thickness C (μm) of the pressure-sensitive adhesive layer 30, and a tack value D (N) of the pressure-sensitive adhesive layer 30 satisfy the following formula (1).

$$A \times (B/C) \times D \geq 20 (\text{MPa} \cdot \text{N}) \tag{1}$$

The pressure-sensitive adhesive tape 100 for protecting a semiconductor formed to satisfy the formula (1) has the following features: the tape 100 is excellent in followability to unevenness typified by the bump surface of a semiconductor wafer, and hence can satisfactorily fill the unevenness; and the amount of adhesive residue on an adherend is small at the time of the peeling of the tape 100. In a related-art pressure-sensitive adhesive tape, followability depending on the hardness and softness of its pressure-sensitive adhesive layer (the followability is improved as the layer becomes softer), and an adhesive residue property similarly depending thereon (an adhesive residue is less liable to occur as the layer becomes harder) are in a trade-off relationship, and hence it has been difficult to achieve both the followability and the adhesive residue property. In at least one embodiment of the present invention, however, while the tape includes the intermediate layer 20, the respective characteristics of the pressure-sensitive adhesive layer 30 and the thickness of the intermediate layer 20 are set to satisfy a specific relationship as described above. Accordingly, both excellent followability and a small amount of the adhesive residue can be achieved at high levels.

The value "A×(B/C)×D" is preferably 23 (MPa·N) or more, more preferably 25 (MPa·N) or more, still more preferably 28 (MPa·N) or more. When the value falls within such range, the above-mentioned effect becomes more significant. The upper limit of the value "A×(B/C)×D" is preferably 250 (MPa·N) or less, more preferably 135 (MPa·N) or less, still more preferably 80 (MPa·N) or less.

The value "A×(B/C)" is preferably from 150 MPa to 500 MPa, more preferably from 175 MPa to 450 MPa, still more preferably from 200 MPa to 400 MPa. When the value falls within such range, the above-mentioned effect becomes more significant.

The term "storage modulus of elasticity" as used herein means a storage modulus of elasticity under room temperature (25° C.) by a nanoindentation method. The storage modulus of elasticity by the nanoindentation method may be measured under the following conditions.
(Measurement Apparatus and Measurement Conditions)
Apparatus: Tribo Indenter manufactured by Hysitron, Inc.
Used indenter: Berkovich (trigonal type)
Measurement method: dynamic measurement
Set indentation depth: 500 nm
Frequency: 100 Hz
Amplitude: 2 nm
Measurement atmosphere: air atmosphere
Sample size: 1 cm×1 cm The term "tack value" as used herein means a tack value measured under room temperature (25° C.) by a probe tack method. The tack value may be measured under the following conditions.
(Measurement Apparatus and Measurement Conditions)
Measurement mode: Constant Load
Probe diameter: 5.0 mm
Probe material: SUS
Contact speed: 30 mm/min
Contact load: 100 gf
Contact time: 1 second
Peel rate: 600 mm/min The initial pressure-sensitive adhesive strength at 23° C. of the pressure-sensitive adhesive tape 100 for protecting a semiconductor according to at least one embodiment of the present invention when bonded to a silicon wafer is preferably 1 N/20 mm or more, more preferably 10 N/20 mm or more, and still more preferably 15 N/20 mm or more. The upper limit of the initial pressure-sensitive adhesive strength at 23° C. of the pressure-sensitive adhesive tape 100 for protecting a semiconductor when bonded to the silicon wafer is, for example, 50 N/20 mm. The pressure-sensitive adhesive strength is measured in conformity with JIS Z 0237:2000. Specifically, the pressure-sensitive adhesive strength is measured by: reciprocating a 2-kilogram roller once to bond the pressure-sensitive adhesive tape 100 for protecting a semiconductor to a 4-inch silicon mirror wafer (manufactured by Shin-Etsu Chemical Co., Ltd.); leaving the resultant to stand under 23° C. for 30 minutes; and then peeling the pressure-sensitive adhesive tape 100 for protecting a semiconductor under the conditions of a peel angle of 180° and a peel rate (tensile rate) of 300 mm/min. As described later, the pressure-sensitive adhesive layer 30 of the pressure-sensitive adhesive tape 100 for protecting a semiconductor according to at least one embodiment of the present invention may be a pressure-sensitive adhesive layer 30 that includes an active energy ray-curable pressure-sensitive adhesive and may show a change in pressure-sensitive adhesive strength when irradiated with an active energy ray. However, the term "initial pressure-sensitive adhesive strength" as used herein means a pressure-sensitive adhesive strength before the active energy ray irradiation.

The pressure-sensitive adhesive strength of the pressure-sensitive adhesive tape 100 for protecting a semiconductor according to at least one embodiment of the present invention may be changed by active energy ray irradiation. The pressure-sensitive adhesive strength at 23° C. of the pressure-sensitive adhesive tape 100 for protecting a semiconductor after having been bonded to a stainless-steel plate and irradiated with UV light having an integrated light quantity of from 300 mJ/cm$^2$ to 1,500 mJ/cm$^2$ (preferably 1,000 mJ/cm$^2$) (wavelength: a high-pressure mercury lamp configured to mainly emit light having a wavelength of 365 nm is used) is preferably from 0.07 N/20 mm to 0.5 N/20 mm, more preferably from 0.08 N/20 mm to 0.3 N/20 mm. When the pressure-sensitive adhesive strength falls within such range, a pressure-sensitive adhesive tape 100 for protecting a semiconductor excellent in peelability after a predetermined step (e.g., a backgrinding step) can be obtained.

The pressure-sensitive adhesive tape 100 for protecting a semiconductor has a thickness of preferably from 10 μm to 700 μm, more preferably from 50 μm to 600 μm, still more preferably from 100 μm to 500 μm.

B. Pressure-Sensitive Adhesive Layer

The pressure-sensitive adhesive layer 100 may include any appropriate pressure-sensitive adhesive as long as the effect of the present invention is obtained. The pressure-sensitive adhesive layer 30 preferably includes an active energy ray-curable pressure-sensitive adhesive. As a base polymer for forming the pressure-sensitive adhesive, there are given, for example, a (meth)acrylic polymer, a vinyl alkyl ether-based polymer, a silicone-based polymer, a polyester-based polymer, a polyamide-based polymer, and a urethane-based polymer. In addition, a polymer obtained by introducing a polymerizable carbon-carbon double bond into each of those polymers may be used.

In at least one embodiment of the present invention, the pressure-sensitive adhesive layer 30 includes an active energy ray-curable pressure-sensitive adhesive containing an acrylic polymer. The active energy ray-curable pressure-sensitive adhesive typically further contains a cross-linking agent and a photopolymerization initiator. The pressure-sensitive adhesive strength, rigidity, and the like of the pressure-sensitive adhesive layer 30 including the active energy ray-curable pressure-sensitive adhesive may be changed by active energy ray irradiation. Examples of the active energy ray include a gamma ray, UV light, visible light, an infrared ray (heat ray), a radio wave, an alpha ray, a beta ray, an electron beam, a plasma flow, an ionizing ray, and a particle beam. In at least one embodiment of the present invention, the active energy ray irradiation is performed by irradiation with UV light having an integrated light quantity of from 300 mJ/cm² to 1,500 mJ/cm² (preferably 1,000 mJ/cm²) (wavelength: a high-pressure mercury lamp configured to mainly emit light having a wavelength of 365 nm is used).

The (meth)acrylic polymer in the active energy ray-curable pressure-sensitive adhesive is typically an acrylic polymer (homopolymer or copolymer) formed of at least one kind of alkyl (meth)acrylate serving as a monomer component. Specific examples of the alkyl (meth)acrylate include (meth)acrylic acid C1-C20 alkyl esters, such as methyl (meth)acrylate, ethyl (meth)acrylate, propyl (meth)acrylate, isopropyl (meth)acrylate, n-butyl (meth)acrylate, isobutyl (meth)acrylate, s-butyl (meth)acrylate, pentyl (meth)acrylate, isopentyl (meth)acrylate, hexyl (meth)acrylate, heptyl (meth)acrylate, 2-ethylhexyl (meth)acrylate, octyl (meth)acrylate, isooctyl (meth)acrylate, nonyl (meth)acrylate, isononyl (meth)acrylate, decyl (meth)acrylate, isodecyl (meth)acrylate, undecyl (meth)acrylate, dodecyl (meth)acrylate, tridecyl (meth)acrylate, tetradecyl (meth)acrylate, pentadecyl (meth)acrylate, hexadecyl (meth)acrylate, heptadecyl (meth)acrylate, octadecyl (meth)acrylate, nonadecyl (meth)acrylate, and eicosyl (meth)acrylate.

The (meth)acrylic polymer in the active energy ray-curable pressure-sensitive adhesive may contain a constituent unit corresponding to any other monomer copolymerizable with the alkyl (meth)acrylate as required for the purpose of improving, for example, the cohesive strength, heat resistance, or cross-linking property of the pressure-sensitive adhesive. Examples of such monomer include: carboxyl group-containing monomers, such as acrylic acid and methacrylic acid; acid anhydride monomers, such as maleic anhydride and itaconic anhydride; hydroxyl group-containing monomers, such as hydroxyethyl (meth)acrylate and hydroxypropyl (meth)acrylate; sulfonic acid group-containing monomers, such as styrenesulfonic acid and allylsulfonic acid; nitrogen-containing monomers, such as (meth)acrylamide, N,N-dimethyl(meth)acrylamide, and acryloylmorpholine; aminoalkyl (meth)acrylate-based monomers, such as aminoethyl (meth)acrylate; alkoxyalkyl (meth)acrylate-based monomers, such as methoxyethyl (meth)acrylate; maleimide-based monomers, such as N-cyclohexylmaleimide and N-isopropylmaleimide; itaconimide-based monomers, such as N-methylitaconimide and N-ethylitaconimide; succinimide-based monomers; vinyl-based monomers, such as vinyl acetate, vinyl propionate, N-vinylpyrrolidone, and methylvinylpyrrolidone; cyanoacrylate monomers, such as acrylonitrile and methacrylonitrile; epoxy group-containing acrylic monomers, such as glycidyl (meth)acrylate; glycol-based acrylic ester monomers, such as polyethylene glycol (meth)acrylate and polypropylene glycol (meth)acrylate; acrylic acid ester-based monomers each having a heterocyclic ring, a halogen atom, a silicon atom, or the like, such as tetrahydrofurfuryl (meth)acrylate, fluorine (meth)acrylate, and silicone (meth)acrylate; olefin-based monomers, such as isoprene, butadiene, and isobutylene; and vinyl ether-based monomers, such as vinyl ether. These monomer components may be used alone or in combination thereof. The content of the constituent unit derived from the other monomer is preferably from 5 parts by weight to 50 parts by weight, more preferably from 10 parts by weight to 40 parts by weight with respect to 100 parts by weight of the (meth)acrylic polymer in the pressure-sensitive adhesive. In at least one embodiment of the present invention, a monomer having a functional group, such as a carboxyl group or a hydroxyl group, is used. The use of the monomer having a functional group, such as a carboxyl group or a hydroxyl group, can provide a (meth)acrylic polymer into which a polymerizable carbon-carbon double bond is easily introduced. The content of a constituent unit derived from the monomer having a carboxyl group or a hydroxyl group is preferably from 1 part by weight to 50 parts by weight, more preferably from 3 parts by weight to 20 parts by weight with respect to 100 parts by weight of the (meth)acrylic polymer in the pressure-sensitive adhesive.

In at least one embodiment of the present invention, the (meth)acrylic polymer has a polymerizable carbon-carbon double bond in a side chain thereof or at a terminal thereof. The (meth)acrylic polymer having a polymerizable carbon-carbon double bond in a side chain thereof or at a terminal thereof may be obtained by, for example, polymerizing a (meth)acrylic polymer having a constituent unit derived from a monomer having any appropriate functional group, and causing a compound having a polymerizable carbon-carbon double bond that can react with the functional group to react with the (meth)acrylic polymer. The amount of the compound having a polymerizable carbon-carbon double bond to be caused to react with the (meth)acrylic polymer is preferably from 4 mol to 30 mol, more preferably from 4 mol to 17 mol with respect to 100 mol of the (meth)acrylic polymer in the pressure-sensitive adhesive.

When the polymer and the compound having a polymerizable carbon-carbon double bond are caused to react with each other as described above, the polymer and the compound having a polymerizable carbon-carbon double bond have functional groups that can react with each other, respectively. Examples of the combination of the functional groups include the combination of a carboxyl group and an epoxy group, the combination of a carboxyl group and an aziridine group, and the combination of a hydroxyl group and an isocyanate group. Of those functional group combinations, the combination of a hydroxyl group and an isocyanate group is preferred in terms of the ease of reaction tracking.

Examples of the compound having a polymerizable carbon-carbon double bond include methacryloyl isocyanate, 2-methacryloyloxyethyl isocyanate (2-isocyanatoethyl methacrylate), and m-isopropenyl-α,α-dimethylbenzyl isocyanate.

The weight-average molecular weight of the (meth)acrylic polymer in the active energy ray-curable pressure-sensitive adhesive is preferably from 300,000 to 2,000,000, more preferably from 500,000 to 1,500,000. The weight-average molecular weight may be measured by GPC (solvent: THF).

The glass transition temperature of the (meth)acrylic polymer in the active energy ray-curable pressure-sensitive adhesive is preferably from −50° C. to 30° C., more preferably from −40° C. to 20° C. When the glass transition temperature falls within such range, a pressure-sensitive adhesive tape 100 for protecting a semiconductor that is excellent in heat resistance and hence may be suitably used in a heating step can be obtained.

The active energy ray-curable pressure-sensitive adhesive may contain an active energy ray-reactive compound (monomer or oligomer). The active energy ray-reactive compound is, for example, a photoreactive monomer or oligomer having a functional group having a polymerizable carbon-carbon multiple bond, such as an acryloyl group, a methacryloyl group, a vinyl group, an allyl group, or an acetylene group. When a polyfunctional monomer having two or more functional groups, such as a polyfunctional acrylate, is used, the monomer may be bonded to the above-mentioned alkyl (meth)acrylate to provide a high-molecular weight (meth)acrylic polymer. Specific examples of the photoreactive monomer include: esterified products of (meth)acrylic acid and polyhydric alcohols, such as trimethylolpropane tri(meth)acrylate, tetramethylolmethane tetra(meth)acrylate, pentaerythritol tri(meth)acrylate, pentaerythritol tetra(meth)acrylate, dipentaerythritol monohydroxypenta(meth)acrylate, dipentaerythritol hexa(meth)acrylate, 1,4-butanediol di(meth)acrylate, 1,6-hexanediol di(meth)acrylate, and polyethylene glycol di(meth)acrylate; a polyfunctional urethane (meth)acrylate; an epoxy (meth)acrylate; and an oligoester (meth)acrylate. In addition, a monomer such as methacryloyl isocyanate, 2-methacryloyloxyethyl isocyanate (2-isocyanatoethyl methacrylate), or m-isopropenyl-α,α-dimethylbenzyl isocyanate may be used. Specific examples of the photoreactive oligomer include dimers to pentamers of the above-mentioned monomers.

In addition, a monomer such as epoxidized butadiene, glycidyl methacrylate, acrylamide, or vinyl siloxane, or an oligomer formed of such monomer may be used as the active energy ray-reactive compound.

Further, a mixture of an organic salt, such as an onium salt, and a compound having a plurality of heterocyclic rings in a molecule thereof may be used as the active energy ray-reactive compound. In the mixture, the organic salt cleaves through active energy ray (e.g., UV light or electron beam) irradiation to generate an ion, and the ion serving as an initiating species may cause a ring opening reaction of the heterocyclic rings to form a three-dimensional network structure. Examples of the organic salt include an iodonium salt, a phosphonium salt, an antimonium salt, a sulfonium salt, and a borate salt. In the compound having a plurality of heterocyclic rings in a molecule thereof, examples of the heterocyclic rings include an oxirane ring, an oxetane ring, an oxolane ring, a thiirane ring, and an aziridine ring.

When the active energy ray-curable pressure-sensitive adhesive contains the active energy ray-reactive compound, the content of the active energy ray-reactive compound is preferably from 0.1 part by weight to 100 parts by weight, more preferably from 0.1 part by weight to 50 parts by weight, still more preferably from 0.1 part by weight to 10 parts by weight with respect to 100 parts by weight of the base polymer in the pressure-sensitive adhesive.

The active energy ray-curable pressure-sensitive adhesive may contain any appropriate photopolymerization initiator. Examples of the photopolymerization initiator include: products available under the product names "Omnirad 184", "Omnirad 651", "Omnirad 369", "Omnirad 379 ex", "Omnirad 819", "Omnirad OXE2", and "Omnirad 127" from IGM Resins B.V.; products available under the product names "Esacure One" and "Esacure 1001M" from Lamberti; and products available under the product names "Adeka Optomer N-1414", "Adeka Optomer N-1606", and "Adeka Optomer N-1717" from Adeka Corporation. The content of the photopolymerization initiator is preferably from 0.1 part by weight to 20 parts by weight, more preferably from 2 parts by weight to 10 parts by weight with respect to 100 parts by weight of the base polymer.

The active energy ray-curable pressure-sensitive adhesive preferably contains a cross-linking agent. Examples of the cross-linking agent include an isocyanate-based cross-linking agent, an epoxy-based cross-linking agent, an oxazoline-based cross-linking agent, an aziridine-based cross-linking agent, a melamine-based cross-linking agent, a peroxide-based cross-linking agent, a urea-based cross-linking agent, a metal alkoxide-based cross-linking agent, a metal chelate-based cross-linking agent, a metal salt-based cross-linking agent, a carbodiimide-based cross-linking agent, and an amine-based cross-linking agent.

In at least one embodiment of the present invention, the isocyanate-based cross-linking agent is preferably used. The isocyanate-based cross-linking agent is preferred because the cross-linking agent can react with various kinds of functional groups. Specific examples of the isocyanate-based cross-linking agent include: lower aliphatic polyisocyanates, such as butylene diisocyanate and hexamethylene diisocyanate; alicyclic isocyanates, such as cyclopentylene diisocyanate, cyclohexylene diisocyanate, and isophorone diisocyanate; aromatic isocyanates, such as 2,4-tolylene diisocyanate, 4,4'-diphenylmethane diisocyanate, and xylylene diisocyanate; and isocyanate adducts, such as a trimethylolpropane/tolylene diisocyanate trimer adduct (manufactured by Nippon Polyurethane Industry Co., Ltd., product name "Coronate L"), a trimethylolpropane/hexamethylene diisocyanate trimer adduct (manufactured by Nippon Polyurethane Industry Co., Ltd., product name "Coronate HL"), and an isocyanurate form of hexamethylene diisocyanate (manufactured by Nippon Polyurethane Industry Co., Ltd., product name "Coronate HX").

The content of the cross-linking agent is preferably from 0.05 part by weight to 20 parts by weight, more preferably from 0.1 part by weight to 10 parts by weight with respect to 100 parts by weight of the base polymer in the pressure-sensitive adhesive. When the content falls within such range, the pressure-sensitive adhesive layer 30 having an appropriately adjusted modulus of elasticity can be formed.

The active energy ray-curable pressure-sensitive adhesive may further contain any appropriate additive as required. Examples of the additive include an active energy ray polymerization accelerator, a radical scavenger, a tackifier, a plasticizer (e.g., a trimellitic acid ester-based plasticizer or a pyromellitic acid ester-based plasticizer), a pigment, a dye, a filler, an anti-aging agent, a conductive material, an antistatic agent, a UV absorber, a light stabilizer, a release modifier, a softener, a surfactant, a flame retardant, and an antioxidant.

The thickness of the pressure-sensitive adhesive layer 30 is preferably from 2 µm to 50 µm, more preferably from 5 µm to 30 µm, still more preferably from 5 µm to 10 µm. When the thickness falls within such range, the pressure-sensitive adhesive tape 100 having a preferred pressure-sensitive adhesive strength as the pressure-sensitive adhesive tape 100 to be used in a backgrinding step can be obtained. In addition, when the thickness falls within such range, even in the case where the storage modulus of elasticity of the pressure-sensitive adhesive layer 30 is high, a pressure-sensitive adhesive tape 100 for protecting a semiconductor excellent in unevenness followability can be obtained.

In at least one embodiment of the present invention, when a load value is measured by thermomechanical analysis (TMA) through indentation of a probe having a diameter of 1.0 mm into the pressure-sensitive adhesive layer 30 to an indentation depth corresponding to 80% of the total thickness of the pressure-sensitive adhesive layer 30 and the intermediate layer 20, a load change amount ($\mu N/(mm^2 \cdot sec)$) from 1 second to 300 seconds after the start of the measurement is 1,600 ($\mu N/(mm^2 \cdot sec)$) or less. The load change amount may be calculated from the equation "{(load value ($\mu N/mm^2$) 300 seconds after start of measurement)−(load value ($\mu N/mm^2$) 1 second after start of measurement)}/299 (seconds)." The load values are measured under an environment at 23° C. In addition, when the rigidity of the pressure-sensitive adhesive layer 30 may be changed by active energy ray irradiation, the load values are load values before the active energy ray irradiation. Details, such as conditions for the thermomechanical analysis (TMA), are described later.

The load change amount is an indicator representing an indentation resistance per one second, and when the change amount is 1,600 ($\mu$N/(mm$^2$·sec)) or less, the pressure-sensitive adhesive layer 30 is excellent in relaxing property. Accordingly, the pressure-sensitive adhesive tape 100 including the pressure-sensitive adhesive layer 30 is excellent in unevenness followability, and hence can satisfactorily fill the unevenness of an adherend surface. The load change amount is preferably 1,550 ($\mu$N/(mm$^2$·sec)) or less, more preferably 1,500 ($\mu$N/(mm$^2$·sec)) or less. The lower limit of the load change amount is, for example, 100 ($\mu$N/(mm$^2$·sec)), preferably 300 ($\mu$N/(mm$^2$·sec)), more preferably 500 ($\mu$N/(mm$^2$·sec)), still more preferably 800 ($\mu$N/(mm$^2$·sec)) from the viewpoint of the formability of the tape.

The storage modulus of elasticity of the pressure-sensitive adhesive layer 30 alone (before its active energy ray irradiation) is preferably from 0.01 MPa to 100 MPa, more preferably from 0.1 MPa to 50 MPa, still more preferably from 1 MPa to 30 MPa. The storage modulus of elasticity of the pressure-sensitive adhesive layer 30 may be adjusted by, for example, the structure of the base polymer (e.g., a monomer kind, a monomer amount, the kind and amount of a cross-linking agent, and the amount of a polymerizable carbon-carbon double bond), the presence or absence of the addition of a plasticizer, a UV oligomer that is UV-curable, or the like, and the molecular weight (method for the polymerization) of the base polymer.

The tack value at 25° C. of the pressure-sensitive adhesive layer 30 forming the pressure-sensitive adhesive tape 100 according to at least one embodiment of the present invention is preferably from 0.05 N to 0.5 N, more preferably from 0.075 N to 0.3 N, still more preferably from 0.1 N to 0.2 N. When the tack value falls within such range, a pressure-sensitive adhesive tape 100 for protecting a semiconductor prevented from having the adhesive residue can be obtained.

C. Intermediate Layer

The intermediate layer 20 may include any appropriate composition for forming the intermediate layer 20 as long as the effect of the present invention is obtained. The composition for forming the intermediate layer 20 contains a base polymer, such as a (meth)acrylic polymer, a vinyl alkyl ether-based polymer, a silicone-based polymer, a polyester-based polymer, a polyamide-based polymer, or a urethane-based polymer.

In at least one embodiment of the present invention, the intermediate layer 20 includes a composition for forming the intermediate layer 20 containing a (meth)acrylic polymer. The composition for forming the intermediate layer 20 may be active energy ray-curable.

The (meth)acrylic polymer in the composition for forming the intermediate layer 20 is, for example, the acrylic polymer (homopolymer or copolymer) described in section B. In the composition for forming the intermediate layer 20, the content of a constituent unit derived from an alkyl (meth)acrylate is preferably from 60 parts by weight to 99.5 parts by weight, more preferably from 80 parts by weight to 98 parts by weight, still more preferably from 90 parts by weight to 98 parts by weight with respect to 100 parts by weight of the (meth)acrylic polymer in the composition for forming the intermediate layer 20.

The (meth)acrylic polymer in the composition for forming the intermediate layer 20 may contain a constituent unit corresponding to any other monomer as required for the purpose of improving, for example, the cohesive strength, heat resistance, or cross-linking property of the composition. Examples of the other monomer include the monomers described in the section B. In the (meth)acrylic polymer in the composition for forming the intermediate layer 20, the content of the constituent unit derived from the other monomer is preferably from 0.5 part by weight to 30 parts by weight, more preferably from 2 parts by weight to 20 parts by weight, still more preferably from 4 parts by weight to 10 parts by weight with respect to 100 parts by weight of the (meth)acrylic polymer in the composition for forming the intermediate layer 20.

The weight-average molecular weight of the (meth)acrylic polymer in the composition for forming the intermediate layer 20 is preferably from 300,000 to 2,000,000, more preferably from 500,000 to 1,500,000.

The glass transition temperature of the (meth)acrylic polymer in the composition for forming the intermediate layer 20 is preferably from −60° C. to 30° C., more preferably from −50° C. to 20° C. When the glass transition temperature falls within such range, a pressure-sensitive adhesive tape 100 for protecting a semiconductor that is excellent in heat resistance and hence may be suitably used in a heating step can be obtained.

The composition for forming the intermediate layer 20 may contain an active energy ray-reactive compound (monomer or oligomer). The use of the active energy ray-reactive compound can provide an active energy ray-curable intermediate layer. Examples of the active energy ray-reactive compound include the monomers described in the section B. When the composition for forming the intermediate layer 20 contains the active energy ray-reactive compound, the content of the active energy ray-reactive compound is preferably from 0.1 part by weight to 100 parts by weight, more preferably from 0.1 part by weight to 50 parts by weight, and still more preferably from 0.1 part by weight to 30 parts by weight with respect to 100 parts by weight of the base polymer in the composition for forming the intermediate layer 20 (e.g., the (meth)acrylic polymer).

The composition for forming the intermediate layer 20 may contain any appropriate photopolymerization initiator. Examples of the photopolymerization initiator include the photopolymerization initiators described in section B. In the composition for forming the intermediate layer 20, the content of the photopolymerization initiator is preferably from 0.1 part by weight to 20 parts by weight, more preferably from 2 parts by weight to 10 parts by weight with respect to 100 parts by weight of the base polymer in the composition for forming the intermediate layer 20.

The composition for forming the intermediate layer 20 may contain any appropriate cross-linking agent. Examples of the cross-linking agent include the cross-linking agents described in the section B. In the composition for forming the intermediate layer 20, the content of the cross-linking agent is preferably from 0.1 part by weight to 10 parts by weight, more preferably from 1 part by weight to 8 parts by weight with respect to 100 parts by weight of the base polymer in the composition for forming the intermediate layer 20.

The composition for forming the intermediate layer 20 may further contain any appropriate additive as required. Examples of the additive include an active energy ray polymerization accelerator, a radical scavenger, a tackifier, a plasticizer (e.g., a trimellitic acid ester-based plasticizer or a pyromellitic acid ester-based plasticizer), a pigment, a dye, a filler, an anti-aging agent, a conductive material, an antistatic agent, a UV absorber, a light stabilizer, a release modifier, a softener, a surfactant, a flame retardant, and an antioxidant.

The thickness of the intermediate layer 20 is preferably from 50 µm to 500 µm, more preferably from 75 µm to 400 µm, and still more preferably from 100 µm to 200 µm. When the thickness falls within such range, the pressure-sensitive adhesive tape 100 for protecting a semiconductor that can satisfactorily fill an uneven surface can be obtained. When the intermediate layer 20 is excessively thick, a problem, such as an unwanted cost increase or the occurrence of a wrinkle when the tape is turned into a roll shape, may occur.

The storage modulus of elasticity of the intermediate layer 20 (before its active energy ray irradiation) is preferably from 0.01 MPa to 50 MPa, more preferably from 0.05 MPa to 30 MPa, still more preferably from 0.08 MPa to 20 MPa. When the storage modulus of elasticity falls within such range, the pressure-sensitive adhesive tape 100 for protecting a semiconductor that can satisfactorily fill an uneven surface can be obtained.

In at least one embodiment of the present invention, as described above, the arrangement of a thick and soft intermediate layer 20 can provide a pressure-sensitive adhesive tape 100 for protecting a semiconductor that is excellent in followability to an uneven surface and hence can satisfactorily fill the uneven surface. The product of the thickness of the intermediate layer 20 and the storage modulus of elasticity of the intermediate layer 20 (before its active energy ray irradiation) is preferably from 100 Pa·m to 10,000 Pa·m, more preferably from 500 Pa·m to 5,000 Pa·m.

D. Base Material

The base material 10 may include any appropriate resin. In at least one embodiment of the present invention, the base material 10 may include a thermoplastic resin. Examples of the resin include: polyolefins, such as low density polyethylene, linear polyethylene, medium density polyethylene, high density polyethylene, ultra low density polyethylene, random copolymerization polypropylene, block copolymerization polypropylene, homopolypropylene, polybutene, and polymethylpentene; an ethylene-vinyl acetate copolymer; an ionomer resin; an ethylene-(meth)acrylic acid copolymer; an ethylene-(meth)acrylic acid ester (random or alternating) copolymer; an ethylene-butene copolymer; an ethylene-hexene copolymer; a polyurethane-based resin; a polyester-based resin, such as polyethylene naphthalate; a polyimide-based resin; polyether ketone; a polystyrene-based resin; polyvinyl chloride; polyvinylidene chloride; a fluorine-based resin; a silicon-based resin; and a cellulose-based resin.

The glass transition temperature of the resin forming the base material 10 is preferably from 60° C. to 500° C., more preferably from 100° C. to 500° C. When the glass transition temperature falls within such range, the pressure-sensitive adhesive tape 100 for protecting a semiconductor that is excellent in heat resistance and hence may be suitably used under a heating situation can be obtained. The term "glass transition temperature" means a temperature at which a loss tangent (tan δ) determined by a DMA method (drawing method) under the conditions of a temperature increase rate of 5° C./min, a sample width of 5 mm, a distance between chucks of 20 mm, and a frequency of 10 Hz has a peak.

The thickness of the base material 10 is preferably from 10 µm to 250 µm, more preferably from 20 µm to 200 µm, still more preferably from 30 µm to 100 µm.

The storage modulus of elasticity of the base material 10 is preferably from 50 MPa to 6,000 MPa, more preferably from 80 MPa to 5,000 MPa. When the storage modulus of elasticity falls within such range, the pressure-sensitive adhesive tape 100 for protecting a semiconductor that may appropriately follow the unevenness of an adherend surface can be obtained.

The surface of the base material 10 may be subjected to any appropriate surface treatment in order to improve, for example, adhesiveness to an adjacent layer and a retention property. Examples of the surface treatment include: chemical or physical treatments, such as chromic acid treatment, ozone exposure, flame exposure, high voltage electric shock exposure, and ionizing radiation treatment; and coating treatment.

E. Method of Producing Pressure-Sensitive Adhesive Tape for Protecting Semiconductor The above-mentioned pressure-sensitive adhesive tape 100 for protecting a semiconductor may be produced by any appropriate method. The pressure-sensitive adhesive tape 100 for protecting a semiconductor is formed by, for example, applying the above-mentioned composition for forming the intermediate layer 20 onto the above-mentioned base material 10 to form the intermediate layer 20, and then applying the above-mentioned pressure-sensitive adhesive to the resultant. In addition, the pressure-sensitive adhesive tape 100 for protecting a semiconductor may be obtained by separately forming the pressure-sensitive adhesive layer 30 on a release liner, and then bonding the resultant to a laminate formed of the base material 10 and the intermediate layer 20.

Various methods such as bar coater coating, air knife coating, gravure coating, gravure reverse coating, reverse roll coating, lip coating, die coating, dip coating, offset printing, flexo printing, and screen printing may each be adopted as a method of applying the composition for forming the intermediate layer 20.

The application methods given as the examples of the method of applying the composition for forming an intermediate layer may each be adopted as a method of applying the pressure-sensitive adhesive.

EXAMPLES

The present invention is specifically described below by way of Examples, but the present invention is not limited to these Examples. Testing and evaluating methods in Examples are as described below. In addition, "part(s)" and "%" are by weight unless otherwise specified.

(1) Storage Modulus of Elasticity A of Pressure-Sensitive Adhesive Layer

An indentation test was performed on the surface of the pressure-sensitive adhesive layer of a pressure-sensitive adhesive tape for protecting a semiconductor under the following conditions, and its nanoindentation modulus of elasticity was determined from the result.

(Measurement Apparatus and Measurement Conditions)
Apparatus: Tribo Indenter manufactured by Hysitron, Inc.
Used indenter: Berkovich (trigonal type)
Measurement method: dynamic measurement
Set indentation depth: 500 nm
Frequency: 100 Hz
Amplitude: 2 nm
Measurement temperature: 25° C.
Measurement atmosphere: air atmosphere
Sample size: 1 cm×1 cm (2) Thermomechanical Analysis (TMA)

The thermomechanical analysis (TMA) of the pressure-sensitive adhesive layer of the pressure-sensitive adhesive tape for protecting a semiconductor was performed under the following conditions to measure a load change amount ($\mu$N/(mm$^2$ sec)) from 1 second to 300 seconds after the start of the measurement.
(Measurement Apparatus and Measurement Conditions)
Apparatus: TMA/SS7100 manufactured by Hitachi High-Tech Science Corporation
Measurement mode: A compression expansion method
Probe diameter: 1.0 mm$\Phi$
Temperature program: Constant at 23° C.
Measurement atmosphere: N$_2$ (flow rate: 200 ml/min)
Indentation amount: 80% of the total thickness of the pressure-sensitive adhesive layer and intermediate layer of the tape Load change amount={(load value ($\mu$N/mm$^2$) 300 seconds after start of measurement)−(load value ($\mu$N/mm$^2$) 1 second after start of measurement)}/299 (seconds)

(3) Tack Value D

The tack value D of the pressure-sensitive adhesive layer of the pressure-sensitive adhesive tape for protecting a semiconductor was measured under the following conditions.
(Measurement Apparatus and Measurement Conditions)
Measurement mode: Constant Load
Probe diameter: 5.0 mm . . . material SUS
Contact speed: 30 mm/min
Contact load: 100 gf
Contact time: 1 second
Peel rate: 600 mm/min (4) Pressure-sensitive Adhesive Strength The initial pressure-sensitive adhesive strength at 23° C. of the pressure-sensitive adhesive tape for protecting a semiconductor when bonded to a silicon wafer was measured in conformity with JIS Z0237:2000. Specifically, the pressure-sensitive adhesive strength was measured by: reciprocating a 2-kilogram roller once to bond the pressure-sensitive adhesive tape for protecting a semiconductor to a 4-inch silicon mirror wafer (manufactured by Shin-Etsu Chemical Co., Ltd.); leaving the resultant to stand under 23° C. for 30 minutes; and then peeling the pressure-sensitive adhesive tape for protecting a semiconductor under the conditions of a peel angle of 180° and a peel rate (tensile rate) of 300 mm/min.

(5) Adhesive Residue Property

An 8-inch mirror wafer was ground with a grinder DFG8560 (finishing grindstone: #2000) to a thickness of 500 $\mu$m, and one PET tape having a width of 20 mm and a thickness of 80 $\mu$m was bonded as a step tape thereto within 5 minutes after the grinding. A produced pressure-sensitive adhesive tape for protecting a semiconductor was bonded in a width of 20 mm (by using a 2-kilogram roller) so as to cross the step tape at the right angle. At a step, the tape to be evaluated rose, and hence part of its pressure-sensitive adhesive surface was brought into contact with air on a line.

After the pressure-sensitive adhesive tape had been bonded as described above, the resultant sample was left to stand at 60° C. for 3 days.

After that, the pressure-sensitive adhesive layer of the pressure-sensitive adhesive tape was irradiated with UV light having an energy of 1,000 mJ, and was peeled at a peel angle of 180° and a rate of 300 mm/min.

When the adhesive residue was present, a linear adhesive residue occurred in a 20-millimeter wide portion where the step tape and the pressure-sensitive adhesive tape were in contact with each other, and hence an adhesive residue property was evaluated by the length of the adhesive residue. The adhesive residue evaluation is indicated as follows:

A circle indicates that no linear adhesive residue is present.

A triangle indicates that a linear adhesive residue accounts for from 10% to 20% of a contact width of 20 mm.

An "x" indicates that a linear adhesive residue accounts for 20% or more of a contact width of 20 mm.

(9) Bump-Filling Property

The pressure-sensitive adhesive tape for protecting a semiconductor was bonded to an 8-inch size bumped wafer having a bump pitch of 400 $\mu$m with a tape-bonding machine DR-3000II (manufactured by Nitto Seiki Co., Ltd.) (bonding conditions; rate: 10 mm/s, bonding temperature: 23° C., bonding pressure: 0.45 MPa, roller hardness: 80°). After the bonding, a bump-filling property was observed with a microscope. An evaluation method was as described below.

The apices of four adjacent bumps were connected with straight lines to form a virtual square. A bump interval was determined by: measuring the length of a diagonal of the square; and subtracting the diameter of each of the bumps from the length of the diagonal. The distance along which the pressure-sensitive adhesive layer of the tape and the surface of the wafer were in close contact with each other on the diagonal was measured, and was defined as a filling distance between the bumps. The bump-filling property was evaluated from the following equation by using the bump interval and the filling distance.

Bump-filling property (%)=(filling distance/bump interval)×100

The bump-filling property is an indicator of the adhesiveness of the pressure-sensitive adhesive tape with a gap between the bumps, and a higher bump-filling property means that the pressure-sensitive adhesive tape and the bumped wafer are in close contact with each other with a smaller number of gaps. A case in which the bump-filling property is low means that the close contact of the pressure-sensitive adhesive tape is insufficient in the root portions of the bumps.

In Table 1, a case in which the bump-filling property was more than 80% was indicated by a circle, a case in which the bump-filling property was from 50% to 80% was indicated by a triangle, and a case in which the bump-filling property was less than 50% was indicated by an "x".

Example 1

A composition for forming an intermediate layer containing 100 parts by weight of an acrylic polymer including ethyl acrylate (EA), butyl acrylate (BA), and acrylic acid (AA) at a weight ratio of 50/50/5, 1 part by weight of a polyisocyanate compound (product name: "CORONATE L", manufactured by Tosoh Corporation), 10 parts by weight of a UV oligomer (product name: "ARONIX M321", manufactured by Toagosei Co., Ltd.), 3 parts by weight of a photopolymerization initiator (product name: "OMNIRAD 651", manufactured by IGM Resins B.V.), and toluene was prepared. The composition was applied to the base material having a thickness of 50 $\mu$m (PET film, manufactured by Toray Industries, Inc., product name: "LUMIRROR 5105"), and was then heated at 120° C. for 120 seconds so that the solvent was removed therefrom. Thus, an intermediate layer having a thickness of 150 $\mu$m was formed.

Meanwhile, 11 mol of hydroxyethyl acrylate (HEA) of an acrylic polymer including 2-ethylhexyl acrylate (2-EHA), acryloylmorpholine, and HEA at a molar ratio of 75/25/22 was modified with 2-isocyanatoethyl methacrylate (KARENZ MOI: manufactured by Showa Denko K.K.) to provide a polymer. A pressure-sensitive adhesive containing 100 parts by weight of the polymer, 4.5 parts by weight of a polyisocyanate compound (product name: "CORONATE L", manufactured by Tosoh Corporation), 10 parts by weight of a UV oligomer (product name: "ARONIX M321", manufactured by Toagosei Co., Ltd.), 3 parts by weight of a photopolymerization initiator (product name: "OMNIRAD 651", manufactured by IGM Resins B.V.), and toluene was prepared. The pressure-sensitive adhesive was applied to the silicone-treated surface of a polyester-based separator having a thickness of 38 μm (product name: "DIAFOIL MRF", manufactured by Mitsubishi Plastics, Inc.), and was then heated at 140° C. for 120 seconds so that the solvent was removed therefrom. Thus, a pressure-sensitive adhesive layer having a thickness of 5 μm was formed.

The pressure-sensitive adhesive layer was transferred onto the intermediate layer. Thus, the pressure-sensitive adhesive tape for protecting a semiconductor including the base material (50 μm), the intermediate layer (150 μm), and the pressure-sensitive adhesive layer (5 μm) was obtained.

The resultant pressure-sensitive adhesive tape for protecting a semiconductor was subjected to the above-mentioned evaluations. The results are shown in Table 1.

Example 2

A composition for forming an intermediate layer containing 100 parts by weight of an acrylic polymer including ethyl acrylate (EA), butyl acrylate (BA), and acrylic acid (AA) at a weight ratio of 50/50/5, 3 parts by weight of a photopolymerization initiator (product name: "OMNIRAD 651", manufactured by IGM Resins B.V.), 1 part by weight of a polyisocyanate compound (product name: "CORONATE L", manufactured by Tosoh Corporation), and toluene was prepared. The composition for forming the intermediate layer was applied to the base material having a thickness of 50 μm (PET film, manufactured by Toray Industries, Inc., product name: "LUMIRROR S105"), and was then heated at 120° C. for 120 seconds so that the solvent was removed therefrom. Thus, an intermediate layer having a thickness of 150 μm was formed.

Meanwhile, 11 mol of hydroxyethyl acrylate (HEA) of an acrylic polymer including 2-ethylhexyl acrylate (2-EHA), acryloylmorpholine, and HEA at a molar ratio of 75/25/22 was modified with 2-isocyanatoethyl methacrylate (KARENZ MOI: manufactured by Showa Denko K.K.) to provide a polymer. The pressure-sensitive adhesive containing 100 parts by weight of the polymer, 4.5 parts by weight of a polyisocyanate compound (product name: "CORONATE L", manufactured by Tosoh Corporation), 3 parts by weight of a photopolymerization initiator (product name: "OMNIRAD 651", manufactured by IGM Resins B.V.), and toluene was prepared. The pressure-sensitive adhesive was applied to the silicone-treated surface of a polyester-based separator having a thickness of 38 μm (product name: "DIAFOIL MRF", manufactured by Mitsubishi Plastics, Inc.), and was then heated at 140° C. for 120 seconds so that the solvent was removed therefrom. Thus, the pressure-sensitive adhesive layer having a thickness of 5 μm was formed.

The pressure-sensitive adhesive layer was transferred onto the intermediate layer. Thus, the pressure-sensitive adhesive tape for protecting a semiconductor including the base material (50 μm), the intermediate layer (150 μm), and the pressure-sensitive adhesive layer (5 μm) was obtained.

The resultant pressure-sensitive adhesive tape for protecting a semiconductor was subjected to the above-mentioned evaluations. The results are shown in Table 1.

Comparative Example 1

A composition for forming the intermediate layer containing 100 parts by mass of an acrylic polymer including ethyl acrylate (EA), butyl acrylate (BA), and acrylic acid (AA) at a mass ratio of 50/50/5, 3 parts by mass of a photopolymerization initiator (product name: "OMNIRAD 651", manufactured by IGM Resins B.V.), 1 part by mass of a polyisocyanate compound (product name: "CORONATE L", manufactured by Tosoh Corporation), 15 parts by mass of a UV oligomer (product name: "ARONIX M321", manufactured by Toagosei Co., Ltd.), 0.05 part by mass of a cross-linking agent (product name: "TETRAD-C", manufactured by Mitsubishi Gas Chemical Company, Inc.), and toluene was prepared. The composition for forming the intermediate layer was applied to the base material having a thickness of 115 μm (ethylene-vinyl acetate copolymer resin (EVA) film, extrusion-molded article of EVAFLEX P1007 manufactured by Du Pont-Mitsui Polychemicals Co., Ltd.), and was then heated at 120° C. for 120 seconds so that the solvent was removed therefrom. Thus, the intermediate layer having a thickness of 120 μm was formed.

Meanwhile, 18 mol of hydroxyethyl acrylate (HEA) of an acrylic polymer including butyl acrylate (BA), ethyl acrylate (EA), and HEA at a molar ratio of 50/50/22 was modified with 2-isocyanatoethyl methacrylate (KARENZMOI: manufactured by Showa Denko K.K.) to provide a polymer. The pressure-sensitive adhesive containing 100 parts by mass of the polymer, 0.07 part by mass of a polyisocyanate compound (product name: "CORONATE L", manufactured by Tosoh Corporation), 15 parts by mass of a UV oligomer (product name: "ARONIX M321", manufactured by Toagosei Co., Ltd.), 1 part by mass of a photopolymerization initiator (product name: "OMNIRAD 651", manufactured by IGM Resins B.V.), and toluene was prepared. The pressure-sensitive adhesive was applied to the silicone-treated surface of a polyester-based separator having a thickness of 38 μm (product name: "DIAFOIL MRF", manufactured by Mitsubishi Plastics, Inc.), and was then heated at 140° C. for 120 seconds so that the solvent was removed therefrom. Thus, the pressure-sensitive adhesive layer having a thickness of 30 μm was formed.

The pressure-sensitive adhesive layer was transferred onto the intermediate layer. Thus, the pressure-sensitive adhesive tape for protecting a semiconductor including the base material (115 μm), the intermediate layer (120 μm), and the pressure-sensitive adhesive layer (30 μm) was obtained.

The resultant pressure-sensitive adhesive tape for protecting a semiconductor was subjected to the above-mentioned evaluations. The results are shown in Table 1.

Comparative Example 2

The pressure-sensitive adhesive tape for protecting a semiconductor including a PET base material having a thickness of 50 μm, the intermediate layer having a thickness of 350 μm, which included an ethylene-vinyl acetate (EVA) copolymer, and the pressure-sensitive adhesive layer having a thickness of 40 μm, which included an acrylic pressure-sensitive adhesive, in the stated order was prepared, and the pressure-sensitive adhesive tape for protecting a semiconductor was subjected to the above-mentioned evaluations. The results are shown in Table 1.

Comparative Example 3

The pressure-sensitive adhesive tape for protecting a semiconductor including an acrylic base material having a thickness of 155 μm, the intermediate layer having a thickness of 115 μm, which included an acrylic polymer, and the pressure-sensitive adhesive layer having a thickness of 40 μm, which included an acrylic pressure-sensitive adhesive, in the stated order was prepared, and the pressure-sensitive adhesive tape for protecting a semiconductor was subjected to the above-mentioned evaluations. The results are shown in Table 1.

Comparative Example 4

The pressure-sensitive adhesive tape for protecting a semiconductor including an EVA base material having a thickness of 120 μm, an intermediate layer having a thickness of 100 μm, which included an acrylic polymer, and a pressure-sensitive adhesive layer having a thickness of 10 μm, which included the acrylic pressure-sensitive adhesive, in the stated order was prepared, and the pressure-sensitive adhesive tape for protecting a semiconductor was subjected to the above-mentioned evaluations. The results are shown in Table 1.

Comparative Example 5

The pressure-sensitive adhesive tape for protecting a semiconductor including the PET base material having a thickness of 50 μm, the intermediate layer having a thickness of 100 μm, which included an acrylic polymer, and the pressure-sensitive adhesive layer having a thickness of 20 μm, which included an acrylic pressure-sensitive adhesive, in the stated order was prepared, and the pressure-sensitive adhesive tape for protecting a semiconductor was subjected to the above-mentioned evaluations. The results are shown in Table 1.

TABLE 1

| | Pressure-sensitive adhesive layer | | | | | |
|---|---|---|---|---|---|---|
| | Pressure-sensitive adhesive strength (N/20 mm) | Pressure-sensitive adhesive kind | Load change amount from 1 second to 300 seconds ($\mu$N/(mm$^2$·sec)) | Storage modulus of elasticity A (MPa) | Thickness C ($\mu$m) | Tack value D (N) |
| Example 1 | 15 | Acrylic | 1,351 | 7.5 | 5 | 0.126 |
| Example 2 | 15 | Acrylic | 1,432 | 13.4 | 5 | 0.13 |
| Comparative Example 1 | 18 | Acrylic | 567 | 2.8 | 30 | 0.132 |
| Comparative Example 2 | 1.4 | Acrylic | 3,341 | 19.1 | 40 | 0.113 |
| Comparative Example 3 | 8 | Acrylic | 1,616 | 7.8 | 40 | 0.22 |
| Comparative Example 4 | 6.3 | Acrylic | 1,508 | 27 | 10 | 0.072 |
| Comparative Example 5 | 10.5 | Acrylic | 1,384 | 21 | 20 | 0.181 |

| | Intermediate layer | | Base material | | | | |
|---|---|---|---|---|---|---|---|
| | Composition for forming intermediate layer | Thickness B ($\mu$m) | Base material kind | Thickness ($\mu$m) | A × (B/C) × D | Adhesive residue property | Bump-filling property |
| Example 1 | Acrylic | 150 | PET | 50 | 28.2 | ○ | ○ |
| Example 2 | Acrylic | 150 | PET | 50 | 52.3 | ○ | ○ |
| Comparative Example 1 | Acrylic | 120 | EVA | 115 | 1.5 | x | ○ |
| Comparative Example 2 | EVA | 350 | PET | 50 | 19.0 | Δ | x |
| Comparative Example 3 | Acrylic | 115 | Acrylic | 155 | 4.9 | x | Δ |
| Comparative Example 4 | Acrylic | 100 | EVA | 120 | 19.3 | Δ | ○ |
| Comparative Example 5 | Acrylic | 100 | PET | 50 | 19 | Δ | ○ |

As is apparent from Table 1, when the storage modulus of elasticity A (MPa) of the pressure-sensitive adhesive layer, the thickness B (μm) of the intermediate layer, the thickness C (μm) of the pressure-sensitive adhesive layer, and the tack value D (N) of the pressure-sensitive adhesive layer are appropriately adjusted to set the value "A×(B/C)×D" to 20 (MPa·N) or more, the pressure-sensitive adhesive tape for protecting a semiconductor that can satisfactorily fill an uneven surface and is prevented from having adhesive residue can be obtained.

What is claimed is:
1. A pressure-sensitive adhesive tape for protecting a semiconductor, comprising:
   a base material layer;
   a pressure-sensitive adhesive layer arranged on at least one side of the base material layer; and an intermediate layer arranged between the base material layer and the pressure-sensitive adhesive layer, wherein a storage modulus of elasticity A (MPa) of the pressure-sensitive adhesive layer, a thickness B (μm) of the intermediate layer, a thickness C (μm) of the pressure-sensitive adhesive layer, and a tack value D (N) of the pressure-sensitive adhesive layer satisfy the following formula:

$$A \times (B/C) \times D \geq 20 \text{ (MPa·N)};$$

the storage modulus of elasticity of the pressure-sensitive adhesive layer is from 1 MPa to 30 MPa;
the tack value at 25° Celsius of the pressure-sensitive adhesive layer is from 0.05 N to 0.5 N; and
the pressure-sensitive adhesive layer comprises an active energy ray-curable pressure-sensitive adhesive containing an acrylic polymer.

2. The pressure-sensitive adhesive tape for protecting a semiconductor according to claim 1, wherein, when a load value is measured by thermomechanical analysis (TMA) through indentation of a probe having a diameter of 1.0 mm into the pressure-sensitive adhesive layer to an indentation depth corresponding to 80% of a total thickness of the pressure-sensitive adhesive layer and the intermediate layer, a load change amount (μN/(mm² sec)) from 1 second to 300 seconds after a start of the measurement is 1,600 (μN/(mm² sec)) or less.

3. The pressure-sensitive adhesive tape for protecting a semiconductor according to claim 1, wherein the pressure-sensitive adhesive layer has a thickness of 2 μm to 50 μm.

4. The pressure-sensitive adhesive tape for protecting a semiconductor according to claim 1, wherein the intermediate layer has a thickness of 50 μm to 500 μm.

* * * * *